(12) United States Patent
Choi (10) Patent No.: US 8,325,262 B2
(45) Date of Patent: Dec. 4, 2012

(54) IMAGE SENSOR AND METHOD FOR MANUFACTURING THE SAME

(75) Inventor: Chee-Hong Choi, Gwangjin-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 940 days.

(21) Appl. No.: 12/326,902

(22) Filed: Dec. 3, 2008

(65) Prior Publication Data

US 2009/0141159 A1    Jun. 4, 2009

(30) Foreign Application Priority Data

Dec. 3, 2007   (KR) .................. 10-2007-0124517

(51) Int. Cl.
*H04N 3/14* (2006.01)
*H04N 5/335* (2006.01)

(52) U.S. Cl. .................. 348/311; 348/315; 348/316

(58) Field of Classification Search .............. 348/75, 348/311, 314–316
See application file for complete search history.

(56) References Cited

U.S. PATENT DOCUMENTS

| | | | | |
|---|---|---|---|---|
| 6,967,388 | B2 * | 11/2005 | Park ............................ | 257/528 |
| 7,544,533 | B2 * | 6/2009 | Mouli et al. ................. | 438/75 |
| 7,804,117 | B2 * | 9/2010 | McKee ........................ | 257/292 |
| 2006/0113460 | A1 * | 6/2006 | Tay ............................ | 250/208.1 |

* cited by examiner

*Primary Examiner* — Thomas K Pham
*Assistant Examiner* — Brandi Thomas
(74) *Attorney, Agent, or Firm* — Sherr & Jiang, PLLC (57) ABSTRACT

An image sensor and a manufacturing method for an image sensor. An image may include a central pixel array that contains pixels disposed in a center of a pixel area, and a peripheral pixel array that contains pixels disposed in a periphery of the pixel area. A gate oxide layer at a center area of a photodiode may have a smaller thickness than a gate oxide layer of pixels at a center area of the photodiode.

3 Claims, 13 Drawing Sheets

IMAGE SENSOR AND METHOD FOR MANUFACTURING THE SAME

The present application claims priority under 35 U.S.C. 119 to Korean Patent Application No. 10-2007-0124517 (filed on Dec. 3, 2007), which is hereby incorporated by reference in its entirety.

BACKGROUND

An image sensor may be a semiconductor device that converts an optical image to an electric signal. An image sensor may be classified as a charge coupled device (CCD) or a complementary metal-oxide semiconductor (CMOS) image sensor (CIS). In a CCD, respective MOS capacitors may be arranged close to one another and charge carriers may be stored in the capacitors and transferred. CMOS technology may use a control circuit and a signal processing circuit as peripheral circuits. A CMOS image sensor may include a number of MOS transistors corresponding to a number of pixels, and may detect outputs in sequence using the MOS transistors in a switching manner. A CCD may require a complicated operation system and manufacturing process. A CCD may also require high power consumption. Furthermore, since it may not be possible to form a signal processing circuit in a CCD chip, it may be difficult to implement a one-chip CCD. To overcome various problems of a CCD, a CMOS image sensor, which may apply a sub-micron CMOS manufacturing technology, may be used.

A CMOS image sensor may include a photodiode and a MOS transistor in a unit pixel. A CMOS image sensor may sequentially detect signals in a switching manner, and may thus determine an image. A CMOS image sensor may consume less power than a CCD, and may also be manufactured through a more simplified process. For example, it may require only about 20 masks to manufacture a CMOS image sensor, whereas a CCD manufacturing process may require 30 to 40 masks. Furthermore, a plurality of signal processing circuits may be embodied in one chip. Accordingly, a CMOS image sensor may be increasingly used in various applications, such as digital still cameras (DSC), PC cameras, mobile cameras, and so forth. A CMOS image sensor may be classified into 3T type, 4T type, 5T type, and so on, according to a number of transistors. A 3T type may include one photodiode and three transistors. A 4T type may include one photodiode and four transistors. A layout of a unit pixel of a 4T-type CMOS image sensor will be described below.

Figure 1:
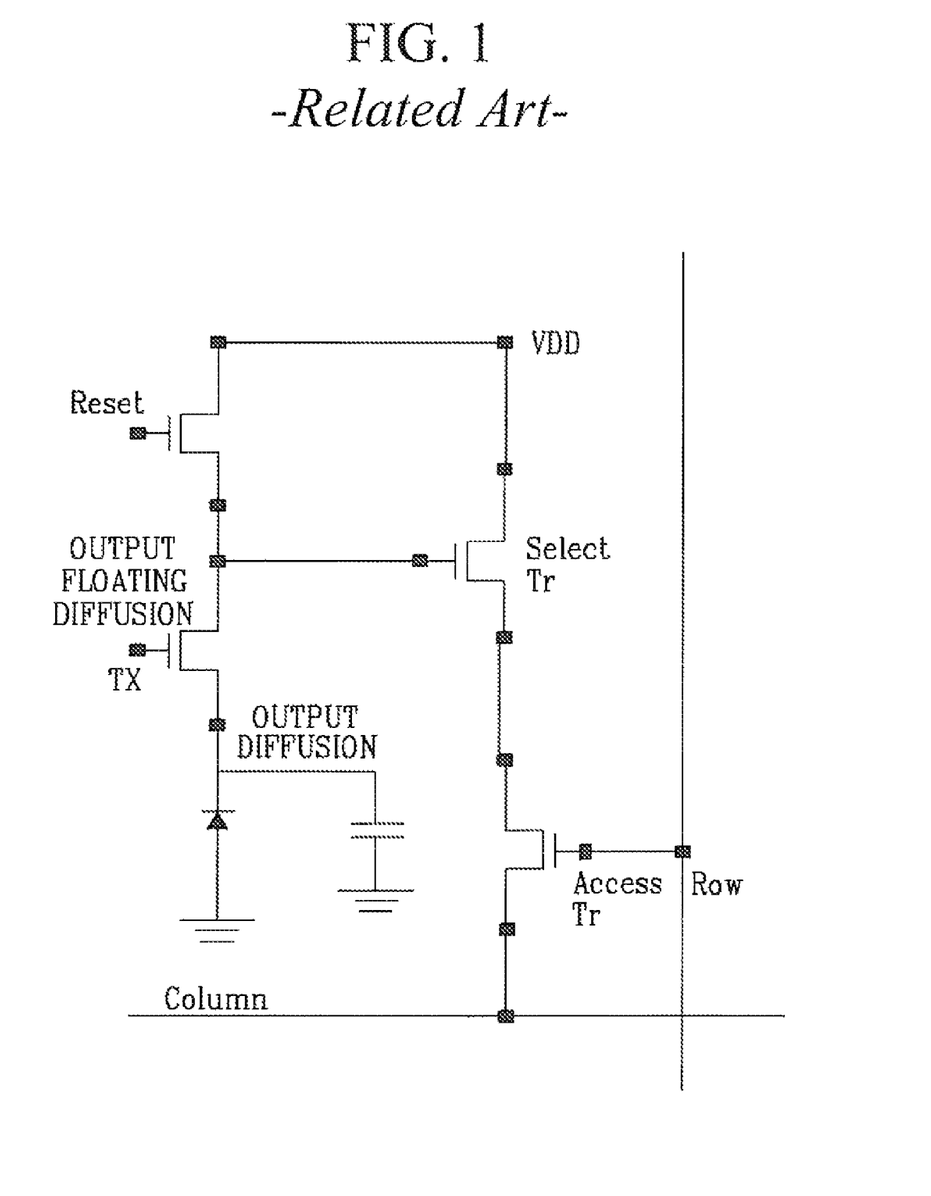
FIG. 1 is a drawing illustrating a layout of a related art 4T-type CMOS image sensor.
Figure 2:
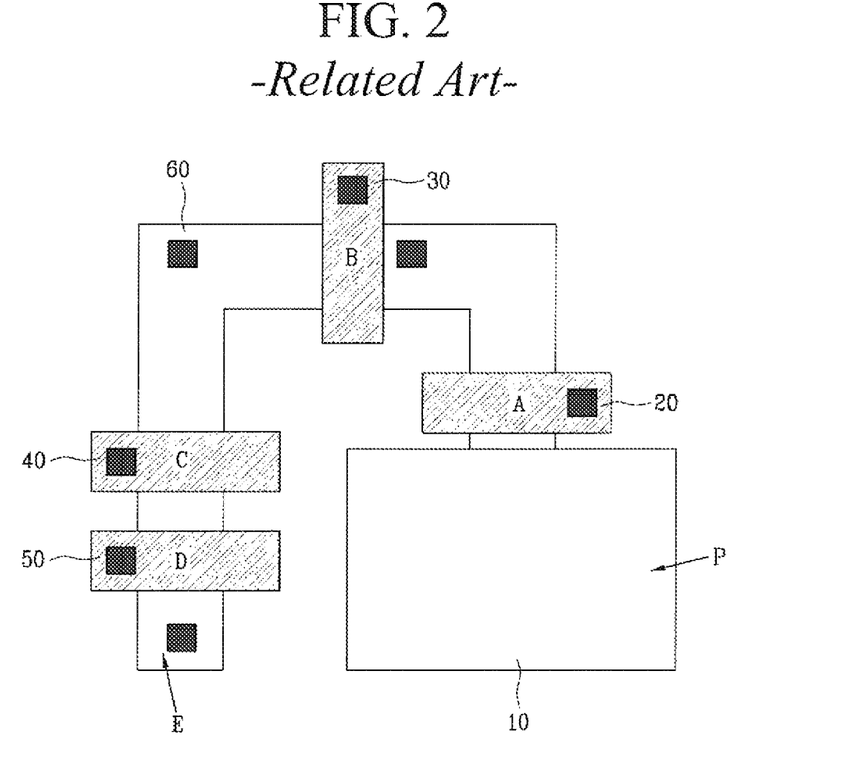
FIG. 2 is a drawing illustrating a layout of a unit pixel of a related art 4T-type CMOS image sensor.

FIG. 1 is a drawing illustrating a layout of a related art 4T-type CMOS image sensor. FIG. 2 is a drawing illustrating a layout of a unit pixel of a related art 4T-type CMOS image sensor. Referring to FIG. 1 and FIG. 2, a unit pixel may include photodiode (P) 10, which may be an optical converter, and four transistors. The four transistors may include transfer transistor (Tx) 20, reset transistor (Rx) 30, drive or access transistor (Dx) 40, and select transistor (Sx) 50. A drain terminal of select transistor 50, which may be an output terminal of each unit pixel, may be electrically connected with a load transistor. Floating diffusion (FD) region 60 may also be provided. An operation processes of a related art CMOS image sensor may be as follows. First, reset transistor B 30 may be powered on, and an output floating diffusion node potential may become a power voltage VDD. A reference value may be detected. Upon incidence of light from outside of the image sensor to photodiode P 10, which may be a light receiving unit, electron-hole pairs (EHPs) may be generated in proportion to an intensity of the incident light. Potential of a source node of transfer transistor A 20 may be changed in proportion to an amount of generated signal charges.

When transfer transistor A 20 is powered on, accumulated signal charges may be transferred to floating diffusion region 60, and a potential of an output floating diffusion node may be changed in proportion to an amount of transferred signal charges. Simultaneously, a gate bias of select transistor D 50 may be changed. As a result, a change of source potential of driving transistor C 40 may occur. In this state, when driving transistor D may be powered on, data may be read out to a column. Reset transistor B 30 may be powered on, and an output floating diffusion node potential may become VDD. These processes may be repeated. At an upper part of respective photodiodes, a color filter array may be formed to separately receive red, green, and blue signals. In addition, a micro lens may be formed at an uppermost part of the light receiving unit, which may allow more light to be received. The signals of respective channels may be connected to an image processing circuit, which may be provided outside of the light receiving unit, through a plurality of metal lines, and may be combined into one image by signal processing.

Figure 3A:
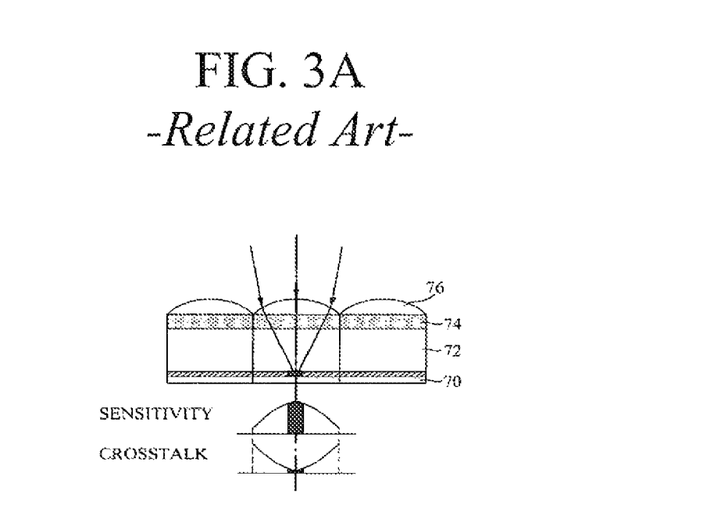
FIG. 3A through FIG. 3C are drawings illustrating a shading effect of a related art CMOS image sensor.
Figure 3B:
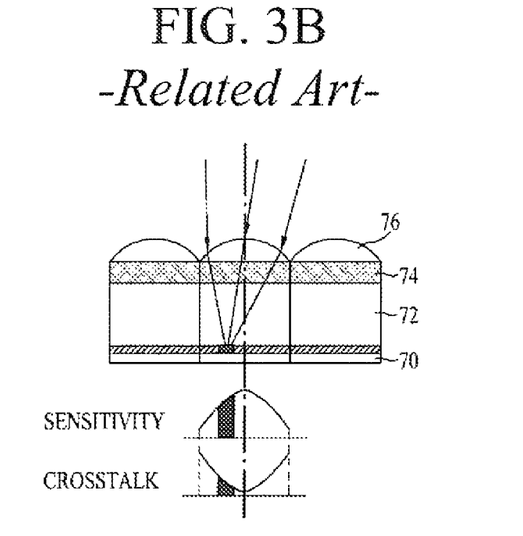
Figure 3C:
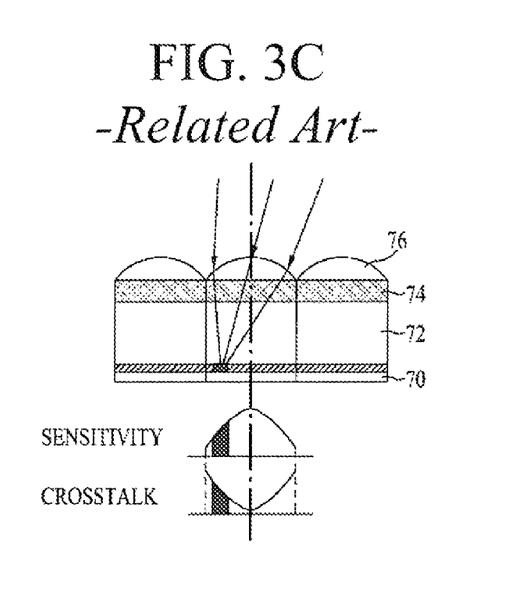

FIG. 3A through FIG. 3C are drawings illustrating a shading effect that may occur in a related art CMOS image sensor, which may include photodiode 70, interlayer dielectric 72, color filter array 74, and micro lens 76. Referring to FIG. 3A through FIG. 3C, an incidence angle of light received through micro lens 76 may be varied according to a position of a pixel. An incidence angle of light being received at a center of a pixel area, as shown in FIG. 3A, may be different from an incidence angle of light being received at a periphery of the pixel area, as shown in FIG. 3B and FIG. 3C. An incidence angle may increase from a center toward a periphery. A shading effect may be caused due to such difference in incidence angles between the center and the periphery. Therefore, the periphery of an image may be shown darker than the center.

SUMMARY

Embodiments relate to an image sensor, and to an image sensor that may be capable of improving a shading effect, and a method for manufacturing the same. Embodiments relate to an image sensor that may be capable of improving a shading effect which may be caused by a difference of incidence angles between a center and a periphery of a pixel area, and a method for manufacturing the same.

According to embodiments, an image sensor may include at least one of the following. A central pixel array including pixels disposed in a center of a pixel area. A peripheral pixel array including pixels disposed in a periphery of the pixel area and a gate oxide layer with a smaller thickness than a gate oxide layer of pixels of the center.

According to embodiments, a method for manufacturing an image sensor may include at least one of the following. Forming an oxide layer and a polysilicon sequentially on and/or over a whole surface of a semiconductor substrate whereon a device isolation area and an active area are defined. Patterning the oxide layer and the polysilicon, to form a gate pattern including the oxide layer and the polysilicon. Forming a photodiode area in an active area by implanting dopant ions using the gate pattern as a mask, where the gate oxide layer of pixels included in a center of a pixel area may be formed thicker than the gate oxide layer of pixels included in a periphery of the pixel area.

According to embodiments, a method for manufacturing an image sensor may include at least one of the following. Forming an oxide layer and a polysilicon sequentially on and/or over a whole surface of a semiconductor substrate whereon a device isolation area and an active area are defined. Patterning the oxide layer and the polysilicon, to form a gate pattern including the oxide layer and the polysilicon. Forming a photodiode area by implanting dopant ions in the active area using the oxide layer as a buffer and using the gate silicon as a mask. Forming a gate oxide layer by removing the oxide layer remaining on and/or over the photodiode area, where the gate oxide layer of pixels included in a center of a pixel area may be formed thicker than the gate oxide layer of pixels included in a periphery of the pixel area.

According to embodiments, a method for manufacturing an image sensor may include at least one of the following. Forming an oxide layer and a polysilicon sequentially on and/or over a whole surface of a semiconductor substrate whereon a device isolation area and an active area are defined. Patterning the oxide layer and the polysilicon, to form a first gate pattern having a first thickness and a second gate pattern having a second thickness, each including the oxide layer and the polysilicon. Forming a first photodiode area and a second photodiode area in an active area by implanting dopant ions using the first and second gate patterns as a mask, respectively, where the first gate oxide layer is formed in a center of a pixel area and the second gate oxide layer is formed in a periphery of the pixel area.

DRAWINGS

Example

DESCRIPTION

Figure 4A:
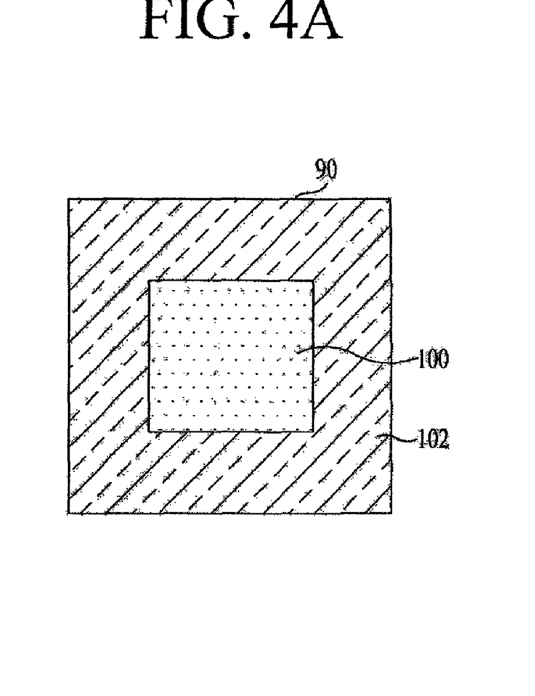
FIGS. 4 to 6 illustrate an image sensor and methods of manufacturing an image sensor in accordance with embodiments.
Figure 4B:
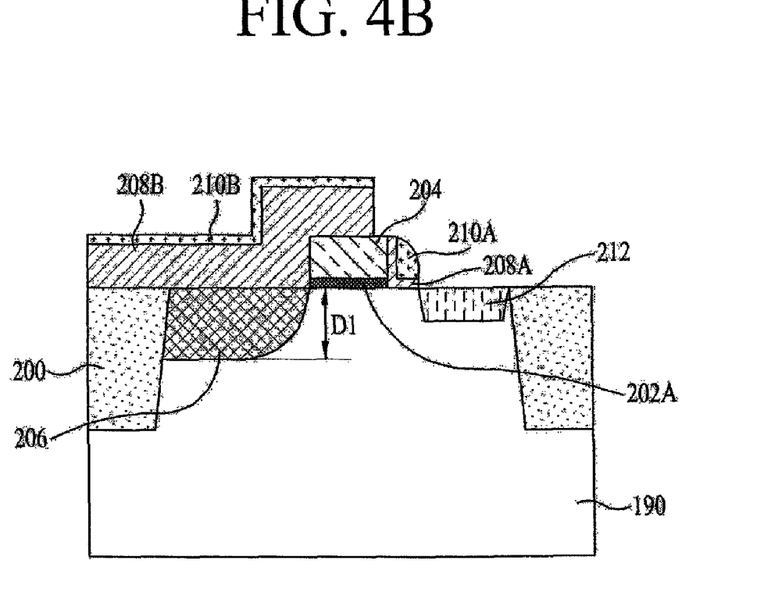
Figure 4C:
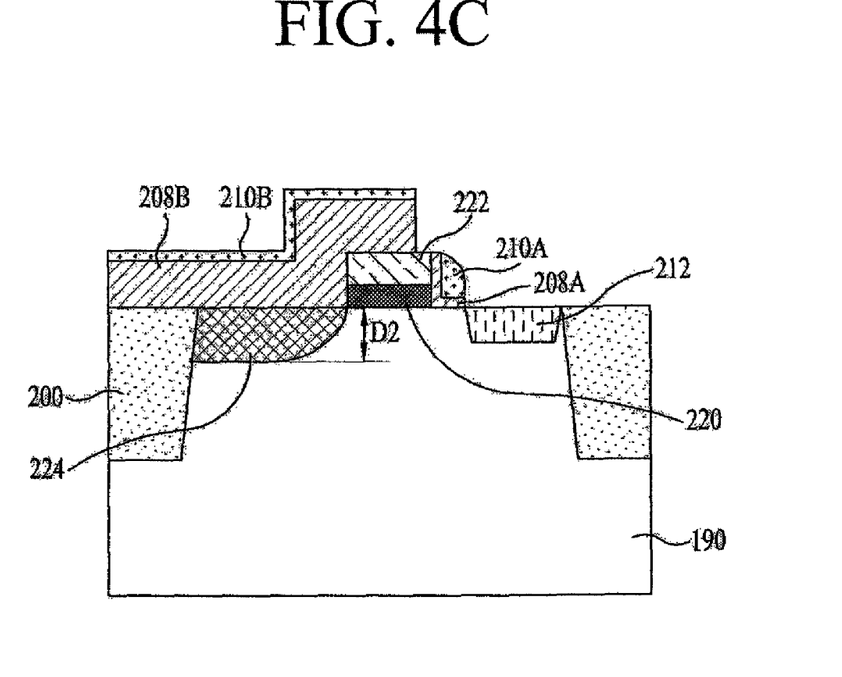

Example FIG. 4A through example FIG. 4C illustrate an image sensor according to embodiments. Example FIG. 4A is a schematic view of pixel area 90 of an image sensor, which may include central pixel array 100 disposed in a center and peripheral pixel array 102 disposed in a periphery. Example FIG. 4B is a sectional view of a unit pixel of peripheral pixel array 102. Example FIG. 4C is a sectional view of a unit pixel included in central pixel array 100.

Central pixel array 100 may include pixels disposed in a center of pixel area 90. Peripheral pixel array 102 may include pixels disposed in a periphery of pixel area 90. According to embodiments, a thickness of a gate oxide layer of each pixel in peripheral pixel array 102 may be smaller than those in central pixel array 100.

Referring to example FIG. 4B, a device isolation area and an active area may be defined on and/or over semiconductor substrate 190. Device isolation layer 200 may be formed in the device isolation area. A gate pattern may include gate oxide layer 202A and gate silicon 204 which may be formed on and/or over semiconductor substrate 190. Photodiode area 206 may be formed in an active area of semiconductor substrate 190. A spacer may be formed on and/or over lateral sides of gate oxide layer 202A and gate silicon 204. According to embodiments, the spacer may have an oxide-nitride-oxide (ONO) structure or an oxide-nitride (ON) structure. According to embodiments, the spacer may be in an ON structure including oxides 210A and 210B and nitrides 208A and 208B. Etched spacers 208A and 210A may be formed on and/or over a right side of gate patterns 202A and 204. Non-etched spacers 208B and 210B may be formed on and/or over a left side. According to embodiments, left spacers 208B and 210B may not be etched since photodiode area 206 may be damaged by etching. Source and drain area 212 may be formed by implanting dopant ions in the active area, and may be formed using gate patterns 202A and 204 and spacers 208A and 210A as masks.

Gate oxide layer 202A of each pixel in peripheral pixel array 102 shown in example FIG. 4B may be formed thinner than gate oxide layer 220 of each pixel in central pixel array 100 of an image sensor shown in example FIG. 4C. As a gate oxide layer is thinned, a threshold voltage of a unit pixel transistor may be reduced. This may improve a saturation property of peripheral pixel array 102. Gate silicon 222 in example FIG. 4C may have the same or a smaller thickness than gate silicon 204 in example FIG. 4B. According to embodiments, depth D1 of photodiode area 206 of each pixel of peripheral pixel array 102 shown in example FIG. 4B may be greater than depth D2 of photodiode area 224 of each pixel of central pixel array 100, shown in FIG. 4C. A light absorbing efficiency may be greater in photodiode area 206 of peripheral pixel array 102 than in photodiode area 224 of central pixel array 100. In other words, although low-intensity light may be received in peripheral pixel array 102, a threshold voltage may be reduced by forming a gate oxide layer thinly. According to embodiments, light absorbing efficiency may be enhanced by forming a photodiode area deep. This may improve a shading effect. Except gate oxide layer 220, gate silicon 222, and photodiode area 224, an image sensor shown in example FIG. 4C may have a same structure as an image sensor of example FIG. 4B. According to embodiments, a thickness of gate oxide layers may decrease from central pixel array 100 toward peripheral pixel array 102 shown in example FIG. 4A.

Example FIG. 5A through 5H are sectional views illustrating a method for manufacturing an image sensor, according to embodiments. Referring to example FIG. 5A, device isolation layer 200 may be formed on and/or over semiconductor substrate 190, and may define device isolation area 200 and an active area. According to embodiments, device isolation layer 200 may be formed by a shallow trench isolation (STI) process or a LOCOS process.

Figure 5A:
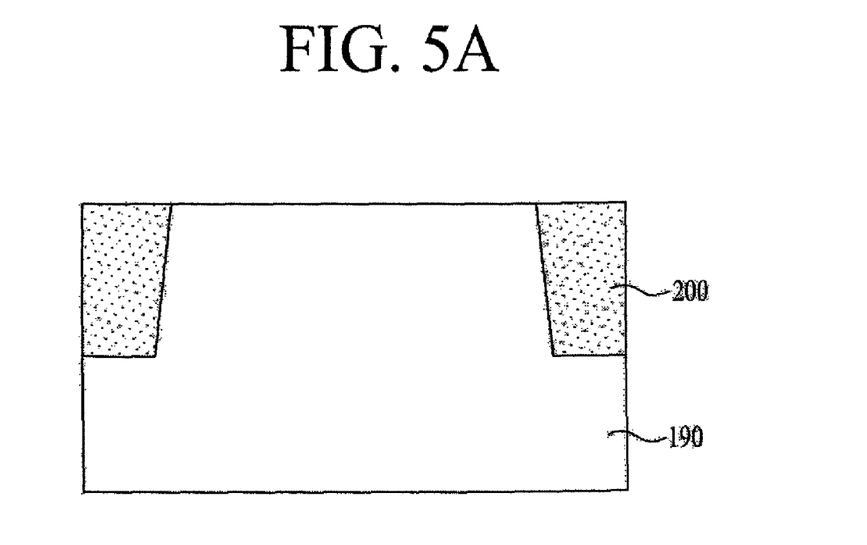
Figure 5B:
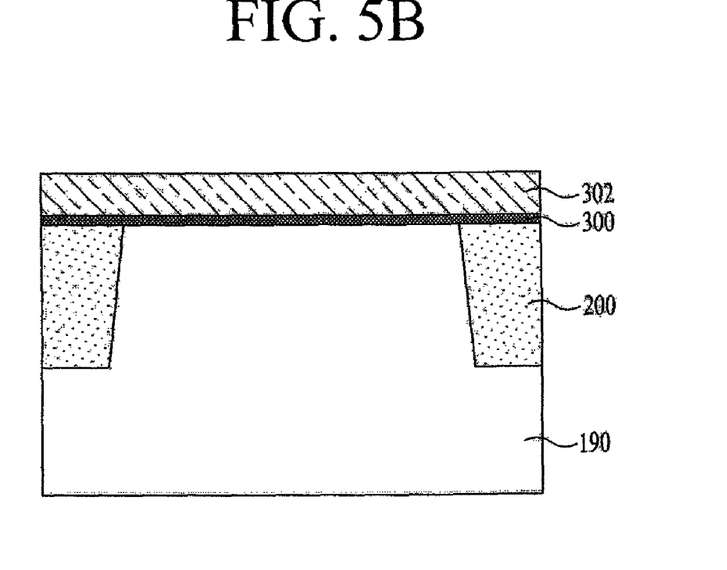

Referring to example FIG. 5B, oxide layer 300 and polysilicon 302 may be sequentially formed on and/or over a surface, for example a whole surface, of semiconductor substrate 190. According to embodiments, oxide layer 300 may be formed thinner for pixels of peripheral pixel array 102 than for pixels of central pixel array 100. According to embodiments, a thickness of oxide layer 300 may be decreased when going toward a periphery from a center of pixel area 90.

Figure 5C:
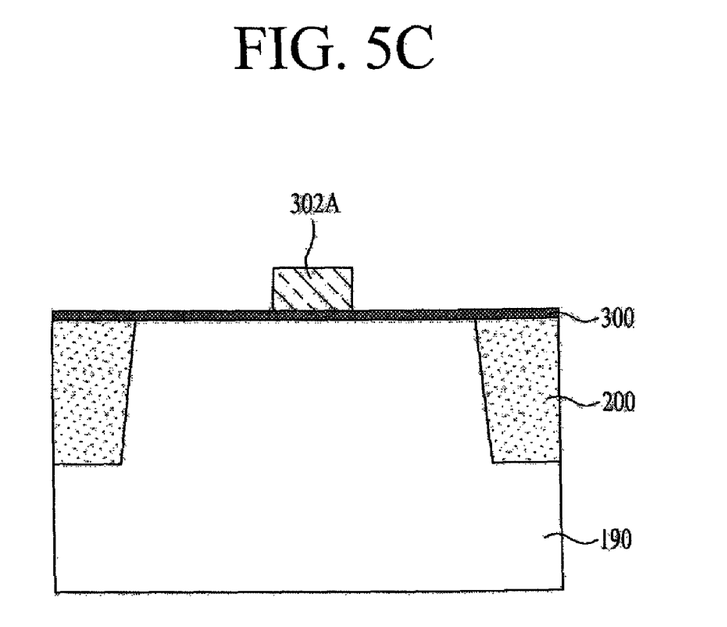

Referring to example FIG. 5C, gate silicon 302A may be formed by patterning polysilicon 302. According to embodiments, gate silicon 302A may correspond to gate silicon 204 of example FIG. 4B or 222 of example FIG. 4C.

Figure 5D:
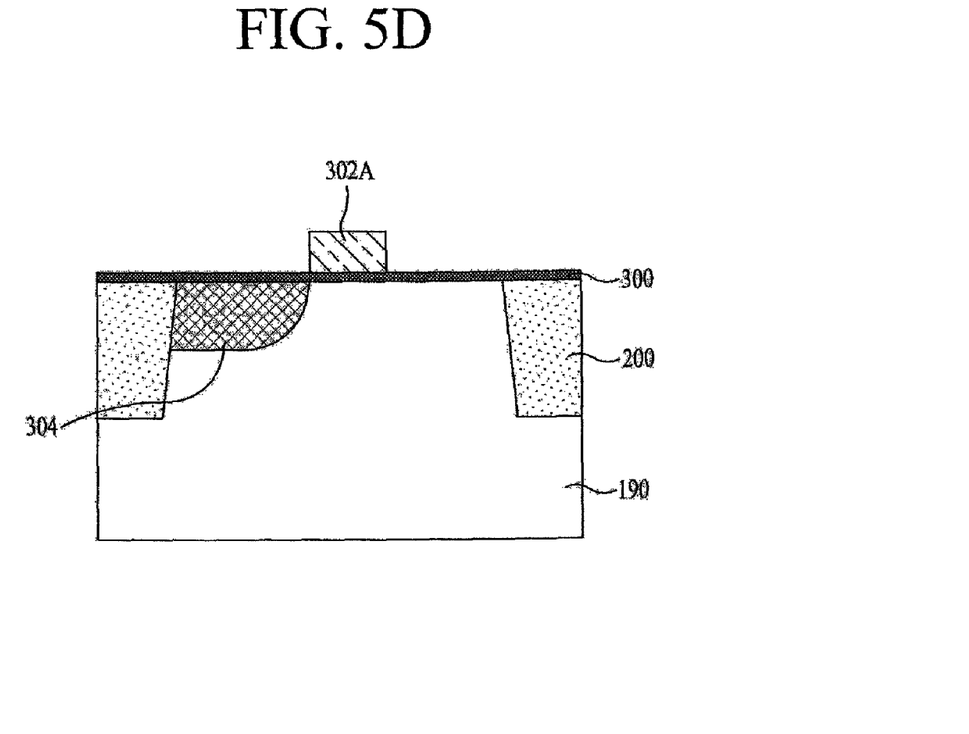

Referring to example FIG. 5D, oxide layer 300 may be used as a buffer and gate silicon 302A may be used as a mask. Dopant ions may be implanted selectively in the active area. This may form photodiode area 304. For a selective dopant ion implantation, a photoresist pattern may be formed by photolithography and then removed. According to embodiments, photodiode area 304 may correspond to photodiode area 206 of example FIG. 4B or 224 of example FIG. 4C. Oxide layer 300 of a pixel of peripheral pixel array 102 may be formed thinner than oxide layer 300 of the pixel of central pixel array 100. Hence, dopant ions may be implanted into a deeper position when forming peripheral pixel array 102 than when forming central pixel array 100. Accordingly, depth D1 of photodiode area 206 in peripheral pixel array 102 may be greater than depth D2 of photodiode area 224 in central pixel array 100.

Figure 5E:
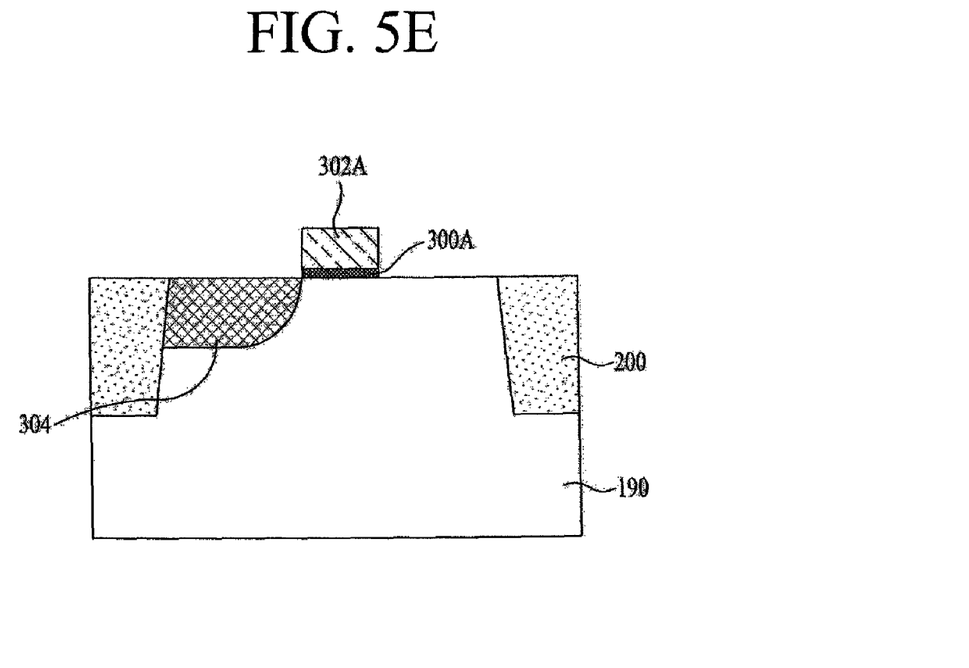

Referring to example FIG. 5E, oxide layer 300, which may remain on and/or over photodiode area 304, may be removed. This may form gate oxide layer 300A. According to embodiments, gate oxide layer 300A may correspond to gate oxide layer 202A of example FIG. 4B or 220 of example FIG. 4C. After oxide layer 300 and polysilicon 302 may be formed on and/or over a surface of semiconductor substrate 190, as shown in example FIG. 5B, oxide layer 300 and polysilicon 302 may be patterned, as shown in example FIG. 5E. This may form a gate pattern including gate oxide layer 300A and gate silicon 302A. Dopant ions may be implanted in an active area using the gate patterns 300A and 302A. This may form photodiode area 304.

Referring to example FIG. 5C through example FIG. 5E, photodiode area 304 may be formed using oxide layer 300. Rather than removing oxide layer 300 after formation of photodiode area 304, photodiode area 304 may be formed after removing oxide layer 300. According to embodiments, a depth of photodiode area 224 of pixels of central pixel array 100 may be equal to a depth of photodiode area 206 of pixels of peripheral pixel array 102. At least two dielectric layers, which may form spacers, may be formed on and/or over a surface, for example an entire surface, of semiconductor substrate 190 that may include gate patterns 300A and 302A. In example FIG. 5F, two dielectric layers 208 and 210 are illustrated for purposes of explanation. According to embodiments, any configuration could be used. According to embodiments, dielectric layer 210 may be an oxide layer while dielectric layer 208 may be a nitride layer.

Figure 5F:
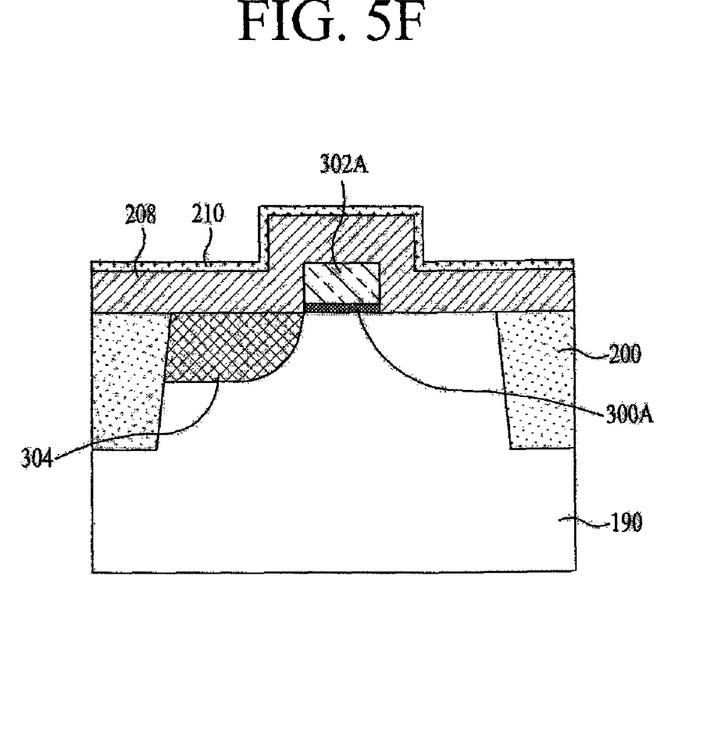
Figure 5G:
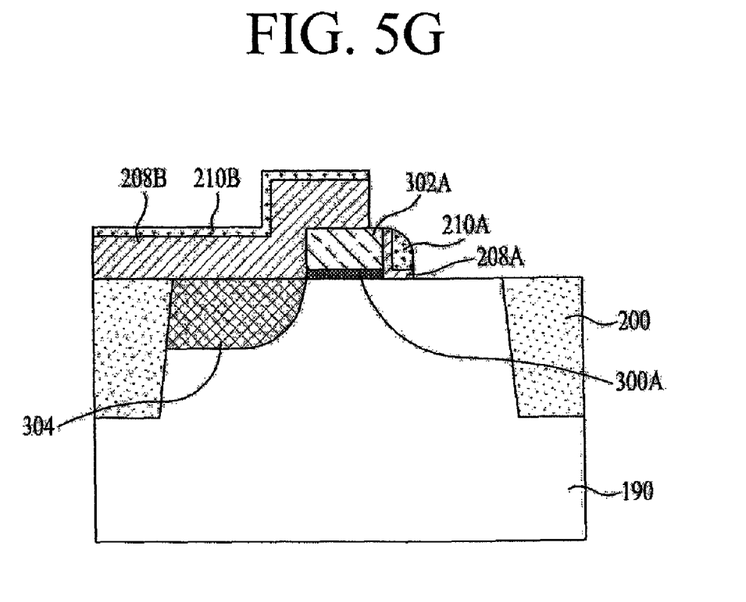

Referring to example FIG. 5G, dielectric layers 208 and 210 may be formed on right sides of gate patterns 300A and 302A and may be etched. This may form spacers 208A and 210A. According to embodiments, dielectric layers 208 and 210, which may be formed on left sides of gate patterns 300A and 302A, may not be etched.

Figure 5H:
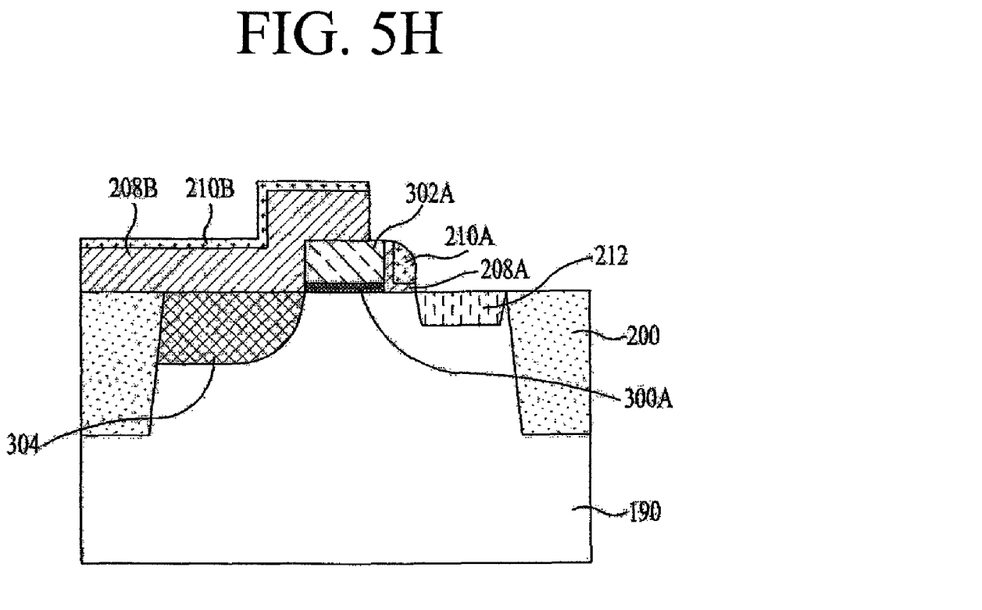

Referring to example FIG. 5H, high-density dopant ions may be implanted using gate patterns 300A and 302A and spacers 208A and 210A as masks. This may form source and drain area 212. Pixels of central pixel array 100 and pixels of peripheral pixel array 102, shown in example FIG. 4A, may be formed either simultaneously or separately. For easier understanding, a description presuming that pixels in center RB corresponding to central pixel array 100 and pixels in periphery RA corresponding to peripheral pixel array 102 are simultaneously formed. According to embodiments, a thickness of the gate oxide layer of the pixels may be reduced from central pixel array 100 toward peripheral pixel array 102.

Example FIG. 6A through FIG. 6I are sectional views illustrating a manufacturing processes of an image sensor, according to embodiments. Referring to example FIG. 6A, first oxide layer 400 may be formed on a surface, for example an entire surface, of semiconductor substrate 190. Referring to example FIG. 6B, photoconductive pattern 402 may be formed on and/or over first oxide layer 400 by photolithography, and may cover first oxide layer 400 only at center RB, and may leave first oxide layer 400 exposed at periphery RA.

Figure 6A:
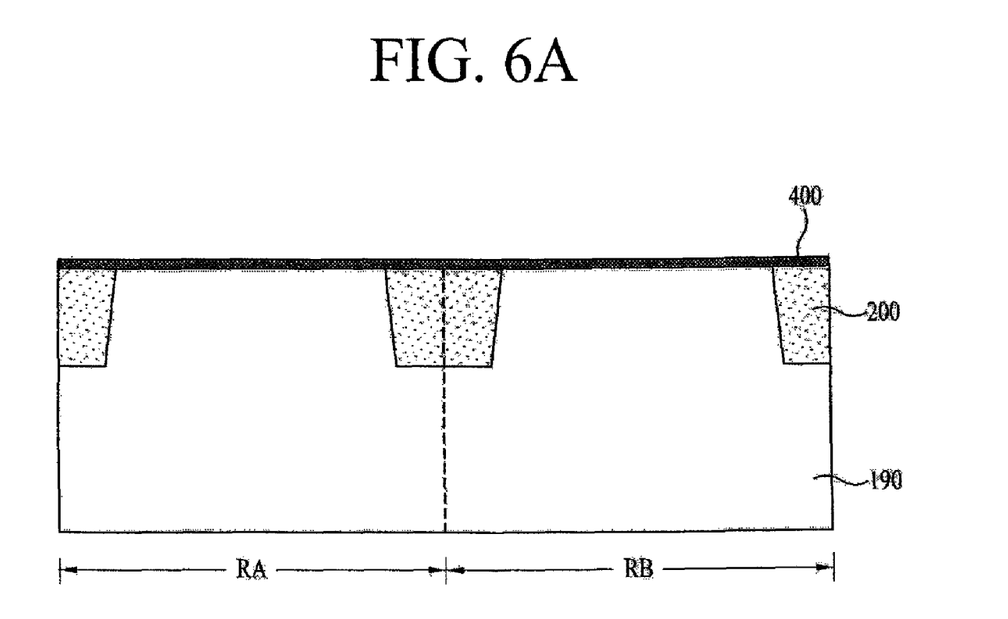
Figure 6B:
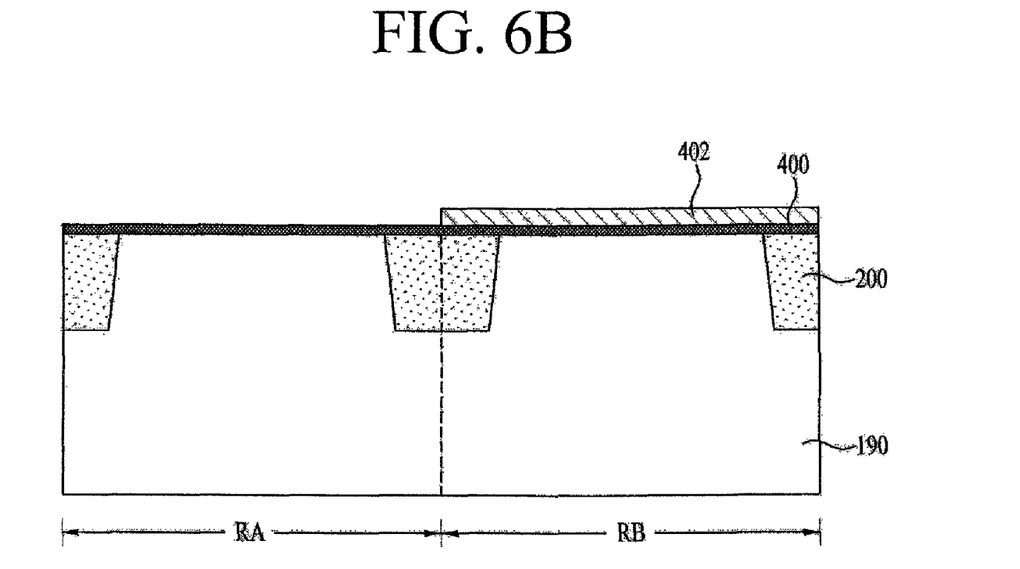
Figure 6C:
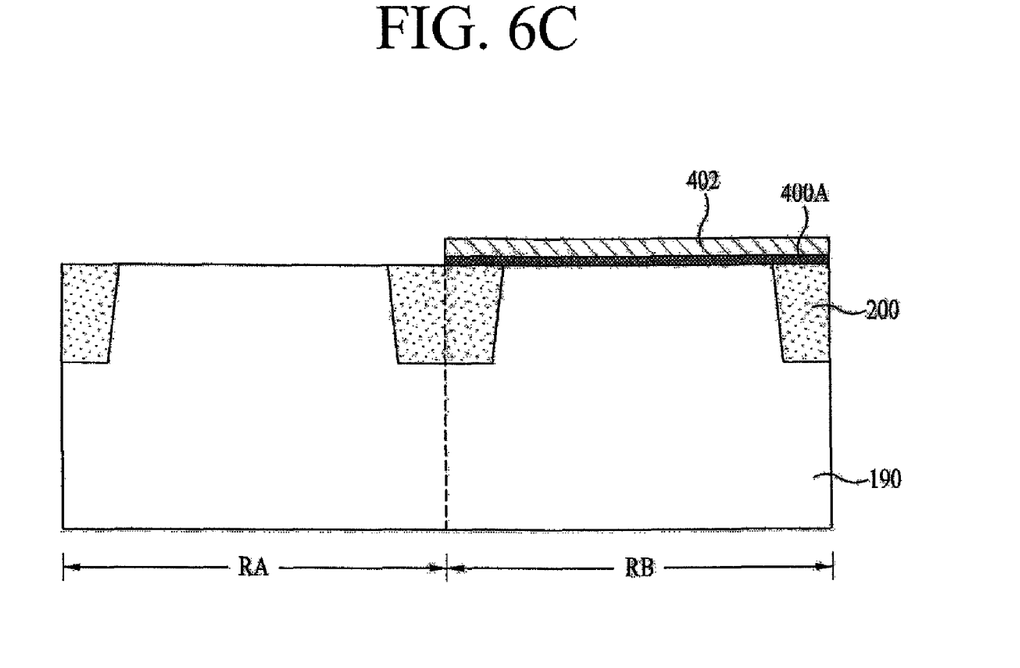
Figure 6D:
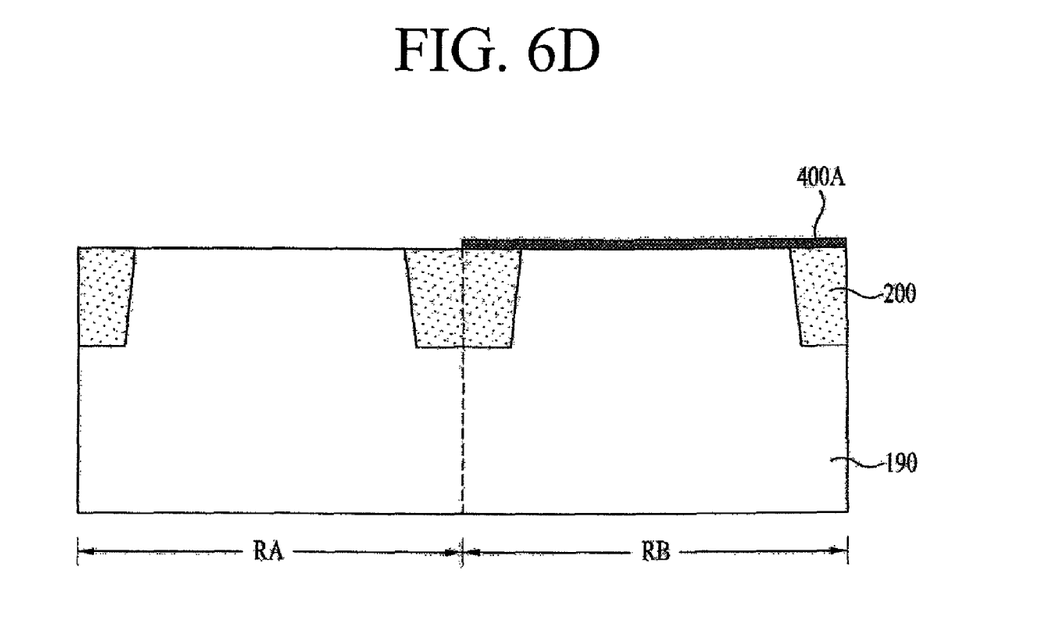

Referring to example FIG. 6C, first oxide layer 400 in periphery RA may be removed by performing etching using photoconductive pattern 402 as a mask. According to embodiments, photoconductive pattern 402 may be removed, as shown in example FIG. 6D. Oxide layer 400A may thereby be left on and/or over semiconductor substrate 190 only in center RB.

Figure 6E:
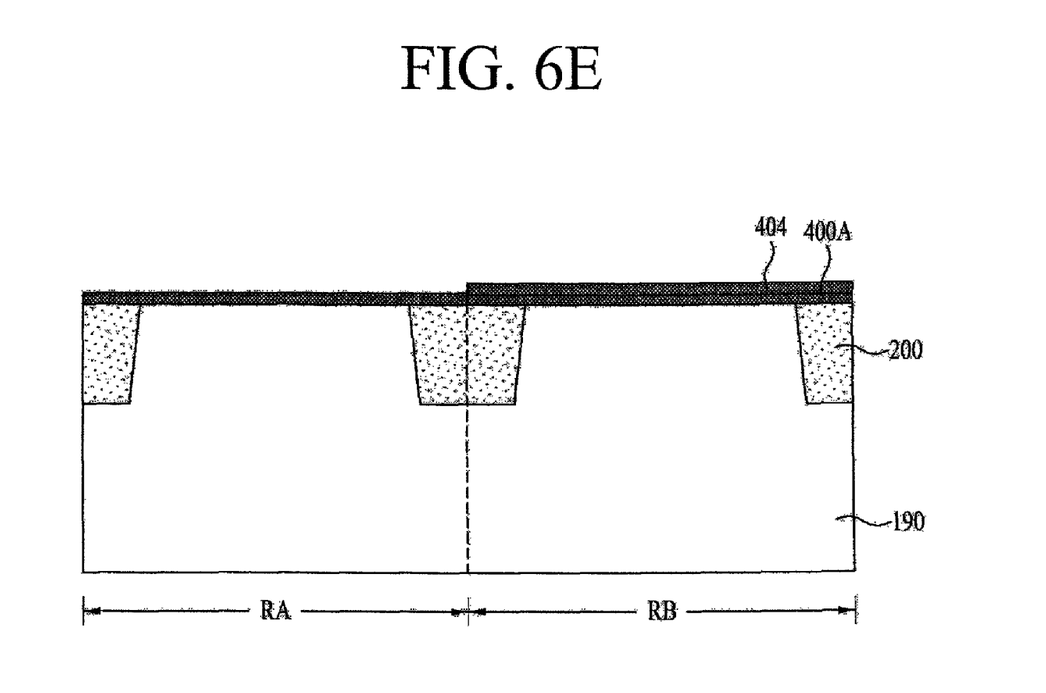
Figure 6F:
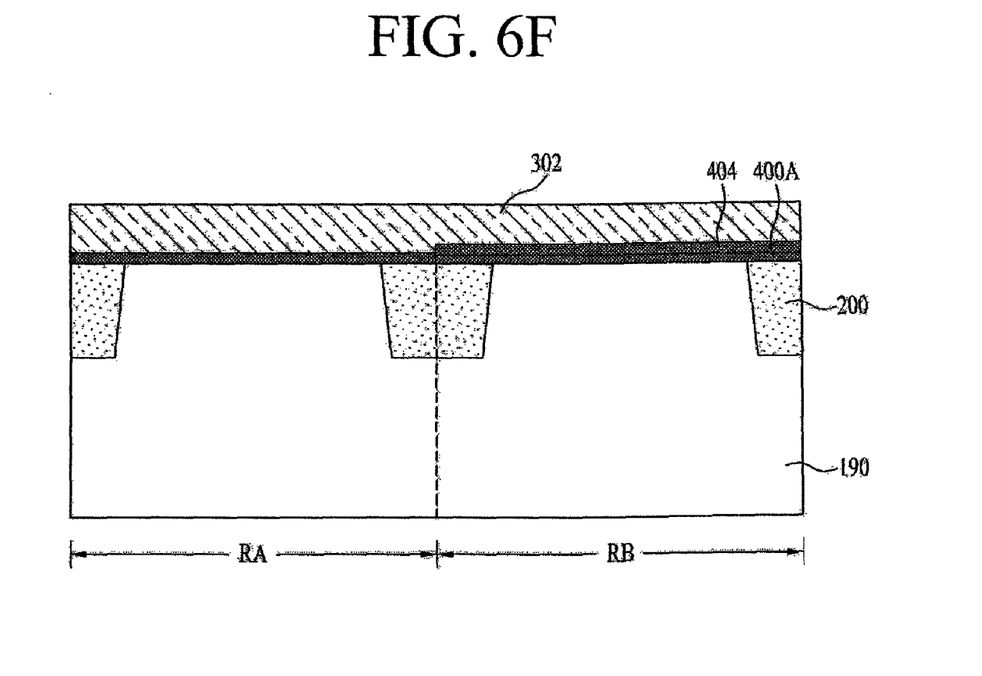

Referring to example FIG. 6E, second oxide layer 404 may be formed on and/or over first oxide layer 400A of pixels of center RB and on and/or over a surface, for example an entire surface, of semiconductor substrate 190 included in periphery RA. According to embodiments, polysilicon 302 may be formed on and/or over second oxide layer 404, as shown in example FIG. 6F.

Figure 6G:
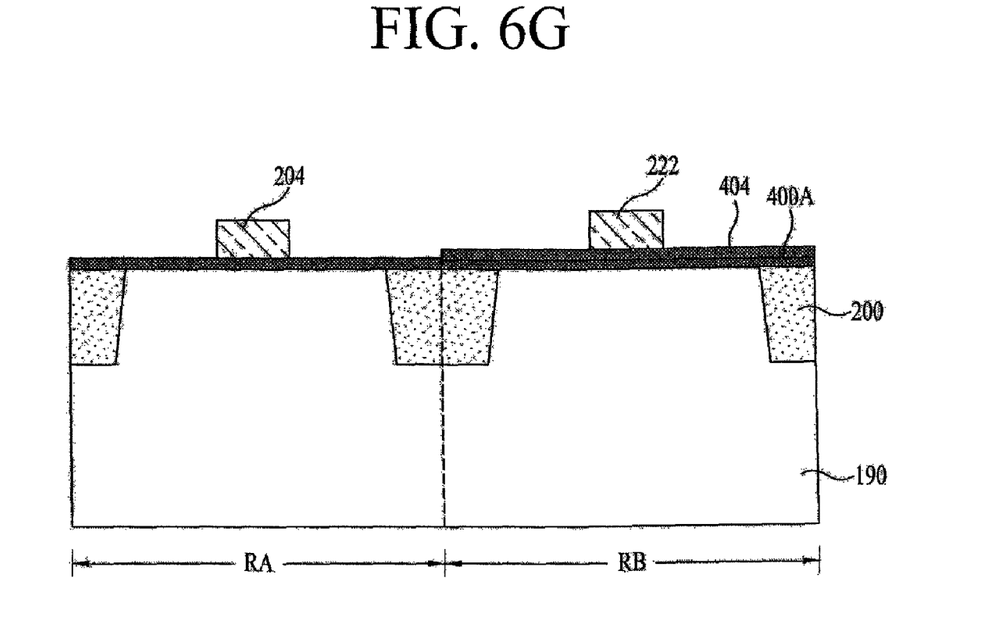
Figure 6H:
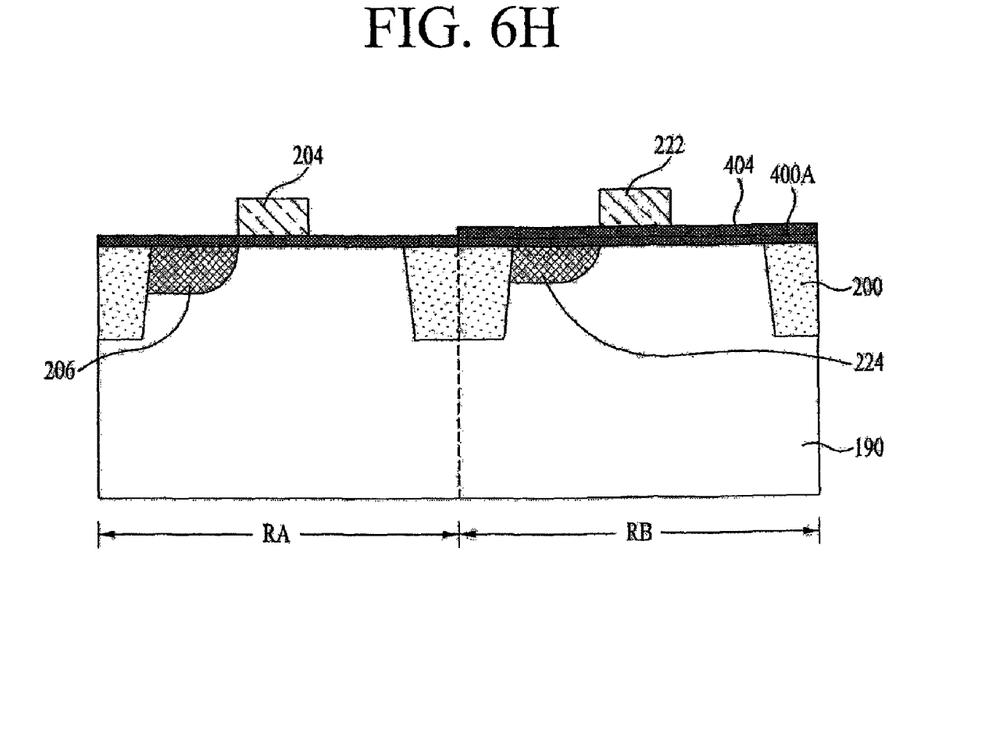

Referring to example FIG. 6G, polysilicon 302 may be patterned, and may form gate silicon 204 of periphery RA and gate silicon 222 of center RB. Referring to example FIG. 6H, in periphery RA, dopant ions may be implanted in the active area using only second oxide layer 404 as a buffer and using gate silicon 204 as a mask. Accordingly, photodiode area 206 may be formed. In central area RB, dopant ions may be implanted in the active area with the oxide layers 400A and 404 as buffers and gate silicon 222 used as a mask. Accordingly, photodiode area 224 is formed. Because second oxide layer 404, which may form pixels of periphery RA, may be thinner than oxide layers 400A and 404, which may form pixels of center RB, the dopant ions may be implanted to a deeper position in periphery RA than in center RB.

Figure 6I:
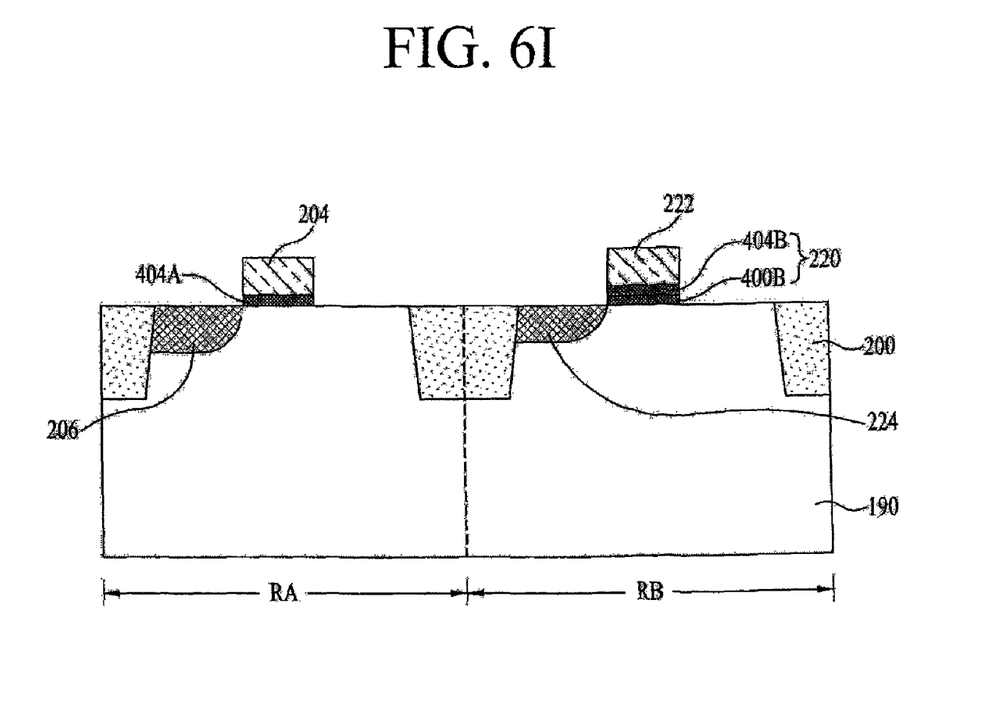

Referring to example FIG. 6I, oxide layers 404 and 400A may be etched. This may form gate oxide layer 404A of periphery RA and gate oxide layers 400B and 404B of center RB. According to embodiments, gate oxide layer 404A of pixels of periphery RA may correspond to gate oxide layer 202A shown in example FIG. 4B while gate oxide layers 400B and 404B of pixels of center RB may correspond to gate oxide layer 220 shown in example FIG. 4C.

The following processes in periphery RA and center RB may be substantially the same as those illustrated in example FIG. 5F through example FIG. 5H. A gate oxide layer of a pixel belonging to a peripheral pixel array may be formed thinner than a gate oxide layer of a pixel belonging to a central pixel array. This may reduce a threshold voltage of a peripheral pixel array. According to embodiments, a saturation property of a pixel may be improved. According to embodiments, since a depth of a photodiode area of the peripheral pixel array may become greater than a depth of a photodiode area of the central pixel array, the light absorbing efficiency may be maximized. This may improve a shading effect of the peripheral pixels.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A device comprising:
   a central pixel array including pixels disposed at a center of a pixel area and a center gate oxide layer having a first thickness;
   a peripheral pixel array including pixels disposed at a periphery of the pixel area and a peripheral gate oxide layer having a second thickness less than the first thickness;
   a semiconductor substrate including a device isolation area and an active area;

a gate pattern including the center gate oxide layer and a gate silicon formed over the semiconductor substrate;

a photodiode area formed in the active area of the semiconductor substrate;

a spacer formed over lateral sides of the center gate oxide gate pattern; and a source and drain area formed in the semiconductor substrate.

2. The device of claim 1, wherein the photodiode area is formed by using the gate pattern as a mask, and wherein the source and drain area is formed by using the gate pattern and the spacer as masks.

3. The device of claim 1, wherein the spacer formed over a first lateral side of the gate pattern above the photodiode area is not etched.

* * * * *